US007607414B2

(12) United States Patent
Kamada et al.

(10) Patent No.: US 7,607,414 B2

(45) Date of Patent: Oct. 27, 2009

(54) MEMBER FOR INTERNAL COMBUSTION ENGINE AND PRODUCTION METHOD THEREOF

(75) Inventors: Seiji Kamada, Yokohama (JP); Hiroshi Kumagai, Kanagawa (JP); Midori Kondou, Kanagawa (JP); Kenji Kikuchi, Yokohama (JP); Takumaru Sagawa, Yokohama (JP); Yutaka Mabuchi, Yokohama (JP); Takahiro Nakahigashi, Kyoto (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 572 days.

(21) Appl. No.: 11/224,300

(22) Filed: Sep. 13, 2005

(65) Prior Publication Data

US 2006/0054127 A1 Mar. 16, 2006

(30) Foreign Application Priority Data

Sep. 14, 2004 (JP) .............................. 2004-266612
Sep. 6, 2005 (JP) .............................. 2005-257422

(51) Int. Cl.
*C23C 16/27* (2006.01)

(52) U.S. Cl. .................. 123/193.1; 123/193.6; 123/657

(58) Field of Classification Search ... 123/193.1–193.6, 123/657–670, 188.1
See application file for complete search history.

(56) References Cited

U.S. PATENT DOCUMENTS 4,909,230 A * 3/1990 Kawamura .................. 123/668
5,249,554 A * 10/1993 Tamor et al. ............. 123/90.51
5,771,873 A * 6/1998 Potter et al. ................. 123/668

FOREIGN PATENT DOCUMENTS

EP 0 874 066 A1 10/1998
JP 59-084274 U 6/1984
JP 62-137630 U 8/1987
JP 62-154250 U 9/1987
JP 02-176148 A 7/1990
JP 10-089199 A 4/1998

* cited by examiner

*Primary Examiner*—M. McMahon
(74) *Attorney, Agent, or Firm*—Foley & Lardner LLP

(57) ABSTRACT

A member for an internal combustion engine, such as a piston, a valve and a fuel injection valve. The member includes a substrate. A carbon-based coating film is formed on the substrate to cover at least a part of a region of the substrate to which region fuel for the internal combustion engine is contactable. The carbon-based coating film contains fluorine and has a thickness of 10 μm or less.

17 Claims, 3 Drawing Sheets

MEMBER FOR INTERNAL COMBUSTION ENGINE AND PRODUCTION METHOD THEREOF

BACKGROUND OF THE INVENTION

The present invention relates to a member for an internal combustion engine, and a piston, a valve, and a fuel injection valve using the member, and a production or manufacturing method of the member for internal combustion engine, and more particularly, a member for an internal combustion engine capable of suppressing deposit, and a piston, a valve, and a fuel injection valve using the member, and a production or manufacturing method of the member for an internal combustion engine.

A so-called deposit is formed on components in a combustion chamber of an internal combustion engine owing to incomplete combustion of fuel. The deposit is a strongly adhesive substance including a mixture of a carbonized matter of the fuel (carbon contents) and a gummy matter of oxidized fuel, and deposits within the combustion chamber, causing deterioration in performance in fuel consumption or exhaust, which has been a problem.

For example, when deposit exists on a crown surface of a piston or a surface of a valve, the fuel becomes wettable and adheres thereto, reducing combustion efficiency of the fuel and therefore increasing unburned hydrocarbon contained in exhaust gas.

To prevent such adhesion of deposit, for example, a fluororesin coating on an inner wall surface of the combustion chamber or an inner wall surfaces of a cylinder head and a piston head, and wall surfaces of the piston head and an intake valve has been proposed in patent literatures JP-UM-A-62-137360, JP-UM-A-62-154250 and JP-A-2-176148.

In particular, in the case of a fuel injection valve of an in-cylinder direct injection engine, since dimensional accuracy of a component is strict, deposition of the deposit on the periphery of a fuel injection hole causes a clogged nozzle opening or deterioration in fuel spray control, which has been a problem.

As measures for preventing such adhesion of the deposit to the injection hole, a nozzle provided with the fluorine-resin coating or a nozzle supplied with dispersion plating using PTFE (polytetrafluoroethylene) particles have been known from patent literatures JP-UM-A-59-84274 and JP-A-10-89199.

SUMMARY OF THE INVENTION

However, the coating films as described in patent literatures JP-UM-A-62-137360, JP-UM-A-62-154250 and JP-A-2-176148 have been insufficient in adhesion to the inner wall surface of the combustion chamber, and therefore have not provided expectation for sufficient durability. Moreover, since such coating films can not efficiently transfer heat from the surface of the valve because of its large thickness, evaporation speed of the fuel has been reduced, causing increase in the unburned hydrocarbon contents in the exhaust gas.

As described in the patent literature JP-UM-A-59-84274, since a fuel injection valve coated with fluororesin typically has a large thickness of 15 μm or more, in addition, unevenness in thickness, it is not suitable for a fuel injection valve to which high dimensional accuracy is required. Furthermore, since it typically employs liquid-phase coating process such as dipping process or spraying process, it has been a problem to prevent clogged liquid in the nozzle orifice.

Furthermore, as described in the patent literature JP-A-10-89199, since the nozzle supplied with nickel plating in which PTFE particles are finely dispersed also has a large thickness of 5 μm or more, it is insufficient for keeping dimensional accuracy, and since the plating is a liquid-phase process, processing liquid in a pickling step or a plating step may remain within the nozzle orifice or on a component joining surface, which has been sometimes a cause of corrosion of the inside of the nozzle opening or a surface of a valve seat.

Therefore, it is an object of the present invention to provide an improved member for an internal combustion engine, which can effectively overcome drawbacks encountered in conventional members for an internal combustion engine, of the similar nature.

Another object of the present invention is to provide an improved member for an internal combustion engine which has repellency to deposit, in other words, capability of preventing the adhesion of the deposit by promptly evaporating adhered liquid fuel.

A further object of the present invention is to provide an improved piston, valve and fuel injection valve which are constituted of the member for an internal combustion engine described in the another object.

A still further object of the present invention is to provide an improved production method of a member for an internal combustion engine which member has repellency to deposit, in other words, capability of preventing the adhesion of the deposit by promptly evaporating adhered liquid fuel.

An aspect of the present invention resides in a member for an internal combustion engine, comprising a substrate. A carbon-based coating film is formed on the substrate to cover at least a part of a region of the substrate to which region fuel for the internal combustion engine is contactable. The carbon-based coating film contains fluorine and has a thickness of 10 μm or less.

Another aspect of the present invention resides in a piston for an internal combustion engine, comprising a piston body. A carbon-based coating film is formed on the piston body to cover at least a part of a region of the piston body to which region fuel for the internal combustion engine is contactable. The carbon-based coating film contains fluorine and has a thickness of 10 μm or less. Here, at least a crown surface of the piston body is coated with the carbon-based coating film.

A further object of the present invention resides in a valve for an internal combustion engine, comprising a valve body. A carbon-based coating film is formed on the valve body to cover at least a part of a region of the valve body to which region fuel for the internal combustion engine is contactable. The carbon-based coating film contains fluorine and has a thickness of 10 μm or less. Here, at least a part selected from the group consisting of a valve stem, a valve head and a surface portion at side of a combustion chamber is coated with the carbon-based coating film.

A still further aspect of the present invention resides in a fuel injection valve for an internal combustion engine, comprising a fuel injection valve body. A carbon-based coating film is formed on the fuel injection valve body to cover at least a part of a region of the fuel injection valve body to which region fuel for the internal combustion engine is contactable. The carbon-based coating film contains fluorine and has a thickness of 10 μm or less. Here, at least an inner surface of the injection valve body, defining an injection hole, is coated with the carbon-based coating film.

A still further aspect of the present invention resides in a method of producing a member for internal combustion engine. The member includes a substrate, and a carbon-based coating film formed on the substrate to cover at least a part of a region of the substrate to which region fuel for the internal combustion engine is contactable, the carbon-based coating film containing fluorine and having a thickness of 10 μm or less. The method comprises forming the carbon-based coating film on the substrate by a vapor phase deposition process.

DETAILED DESCRIPTION OF THE INVENTION

Figure 1:
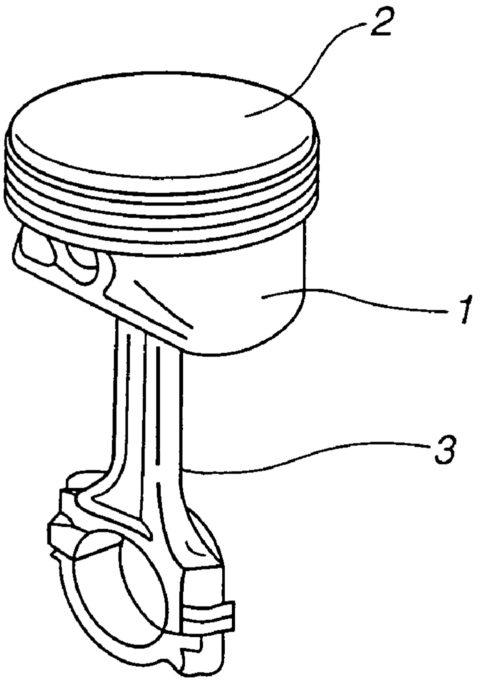
FIG. 1 is a perspective view of an example of a piston which is an embodiment of the present invention.

Hereinafter, a member for internal combustion engine of the invention will be described in detail. In the specification and claims, "%" indicates percent by mass unless otherwise specified.

The member for internal combustion engine of the invention comprises a substrate and a carbon-based coating film for coating the substrate. The carbon-based coating film is coated on at least a part of region (of the substrate) to which fuel for internal combustion engine contacts. Furthermore, the carbon-based coating film or thin film is made to contain fluorine (F) and has a thickness of 10 μm or less.

The carbon-based coating film or thin film is provided on the fuel contacting region in this way, by which adhesion of the carbon contents (soot produced during burning deteriorated gasoline or engine oil) or fuel penetrated into the contents on the inside of a combustion chamber as deposit is suppressed, and therefore efficient combustion operation can be achieved continuously for a long time. Moreover, deposition of the deposit is further suppressed by the fluorine contained in the carbon-based coating film. Furthermore, the thickness of the carbon-based coating film of 10 μm or less improves heat transfer efficiency, and therefore even if fuel is adhered to the film, the fuel promptly evaporates. The thickness of the carbon-based coating film is preferably 0.05 to 5 μm. When the thickness exceeds 10 μm, evaporation speed is reduced and the deposit increases.

While the carbon-based coating film can be disposed on at least a part of the fuel contacting region, it is desirably coated on the entire of the fuel contacting region. In addition, if the coating thickness is 10 μm or less, the film can be coated with the thickness being changed appropriately depending on a contacting level of the fuel or combustion methods.

Here, it is preferable that the carbon-based coating film has a fluorine and carbon content, in atomic number ratio, of (fluorine/carbon)≧0.25. More preferably, the content is 0.25≦(fluorine/carbon)≦2.2. In this case, the deposit hardly adheres to the coating film.

It is also preferable that the fluorine and carbon content in a region of from the uppermost surface of the carbon-based coating film to a depth of 4 nm is made as (fluorine>carbon) ≧0.4 in atomic number ratio, and more preferably (fluorine/carbon)=1 to 2.2. In this case, the repellency to the deposit is excellent.

Furthermore, it is preferable that the content of fluorine is designed such that it is largest at the uppermost surface portion of the carbon-based coating film and decreases with approach to the substrate. In this case, excellent repellency to the deposit is easily maintained at an exposure surface side of the carbon-based coating film because of high F concentration, and adhesion to the substrate tends to be improved at a side of an interface to the substrate because of low F concentration.

The carbon-based coating film can be formed by various deposition methods including specifically PVD and CVD.

Furthermore, examples of the carbon-based coating film are thin films formed by adding fluorine to materials such as a-c (amorphous carbon), a-c:H (hydrogen-containing amorphous carbon) containing hydrogen, and MeC partially containing a metal element such as titanium (Ti) or molybdenum (Mo).

Furthermore, for the substrate coated with the carbon-based coating film, stainless steel or other steel, metal material such as aluminum and titanium, or polymer material such as various resin or rubber can be typically used.

Here, in the member for an internal combustion, when the carbon-based coating film containing fluorine is coated on the substrate, it has a problem of adhesion to the substrate because the coating film has a low adhesive characteristics. Hereinafter, the method of improving adhesion of the coating film to the substrate will be described.

To improve the adhesion, it is the easiest method to make rough the surface of the substrate. Examples of methods for preparing the rough surface are machining, sandblast, etching and die transfer. In this case, it is preferable that the surface of the substrate has a surface roughness (Ra) 0.1 to 3 μm.

It is also preferable that a middle layer (film) is installed or formed between the substrate and the carbon-based coating film. It is preferable that the middle layer contains carbon and/or silicon at least, and more preferably contains no fluorine. To install the middle layer, the middle layer bridges between the substrate and the carbon-based coating film and prevents the substrate from fluoridation in a deposition process.

Furthermore, it is preferable that a fluorine content increases gradually from the middle layer to the carbon-based coating film, by which the adhesion between the middle layer and the carbon-based coating is improved.

Furthermore, a heat treatment at the condition of 80 to 270° C. after the deposition of the carbon-based coating film improves the adhesion remarkably. It is speculated that an internal stress of the coating film is relieved, and a peel stress between the substrate and the carbon-based coating film decreases, by virtue of the heat treatment.

Next, a piston of the invention will be described in detail.

The piston of the invention is constituted of the member for internal combustion engine, in which at least a crown surface is coated with the carbon-based coating film. Accordingly, adhesion of the deteriorated gasoline or engine (lubricating) oil and the deposit is suppressed.

Here, an embodiment of the piston of the invention is shown in FIG. 1.

Such a piston, which is to be used in a spark-ignition gasoline-fueled internal combustion engine, includes a piston body 1 having a piston crown surface 2, and is connected to a connecting rod 3 via a piston pin (not shown). A carbon-based coating film that has a thickness of 10 μm or less and contains fluorine is coated on piston crown surface 2.

A Type of the internal combustion engine is not particularly limited, and the piston can be also used in, for example, an in-cylinder fuel injection spark-ignition internal combustion engine, a premix self compression-ignition internal combustion engine, and a diesel engine.

Next, a valve of the invention will be described in detail.

The valve of the invention is constituted of the member for internal combustion engine, wherein a valve stem, a valve head or a surface portion at a side of a combustion chamber, and a region where these are optionally combined are coated with the carbon-based coating film. Accordingly, adhesion of the deteriorated gasoline or engine oil and the deposit is suppressed.

Figure 2:
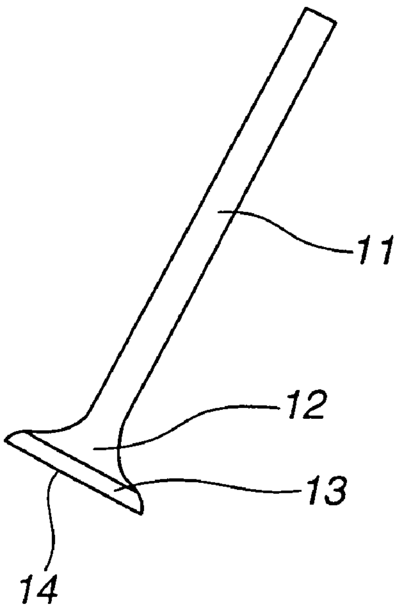
FIG. 2 is a front view of an example of a valve which is another embodiment of the present invention.

Here, an embodiment of the valve of the invention is shown in FIG. 2.

Such a valve, which is to be used in the engine, has a valve body including a valve stem 11, A valve head 12, a contact surface portion 13 contactable to a cylinder head, and a surface portion 14 at the side of the combustion chamber. The carbon-based coating film that has a thickness of 10 μm or less and contains fluorine is coated on one or all of regions of valve stem 11, valve head 12, and surface portion 14 at the side of the combustion chamber. Contact surface 13 to the cylinder head is a portion where the cylinder head and the valve contact to each other to be worn, therefore it is not required to be coated with the carbon-based coating film. The type of the internal combustion engine is not particularly limited, and the valve can be also used in, for example, the in-cylinder fuel injection spark-ignition internal combustion engine, the premix self compression-ignition internal combustion engine, and the diesel engine. Furthermore, the above-arranged valve can be used for either one or both of an intake valve and an exhaust valve.

Next, a fuel injection valve of the invention will be described in detail.

The fuel injection valve of the invention is constituted of the member for internal combustion engine, wherein at least an injection hole (specifically the inner wall defining the hole) is coated with the carbon-based coating film. Accordingly, accurate fuel injection is performed while maintaining dimensional accuracy of the fuel injection. Moreover, deterioration in spraying performance due to adhesion of deposit is prevented, causing stabilized performance in fuel consumption or exhaust gas.

Figure 3:
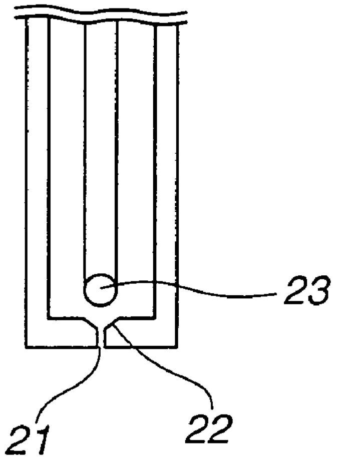
FIG. 3 is a fragmentary schematic sectional view of an example of a nozzle of a fuel injection valve for in-cylinder fuel injection, the fuel injection valve being a further embodiment of the present invention.
Figure 4:
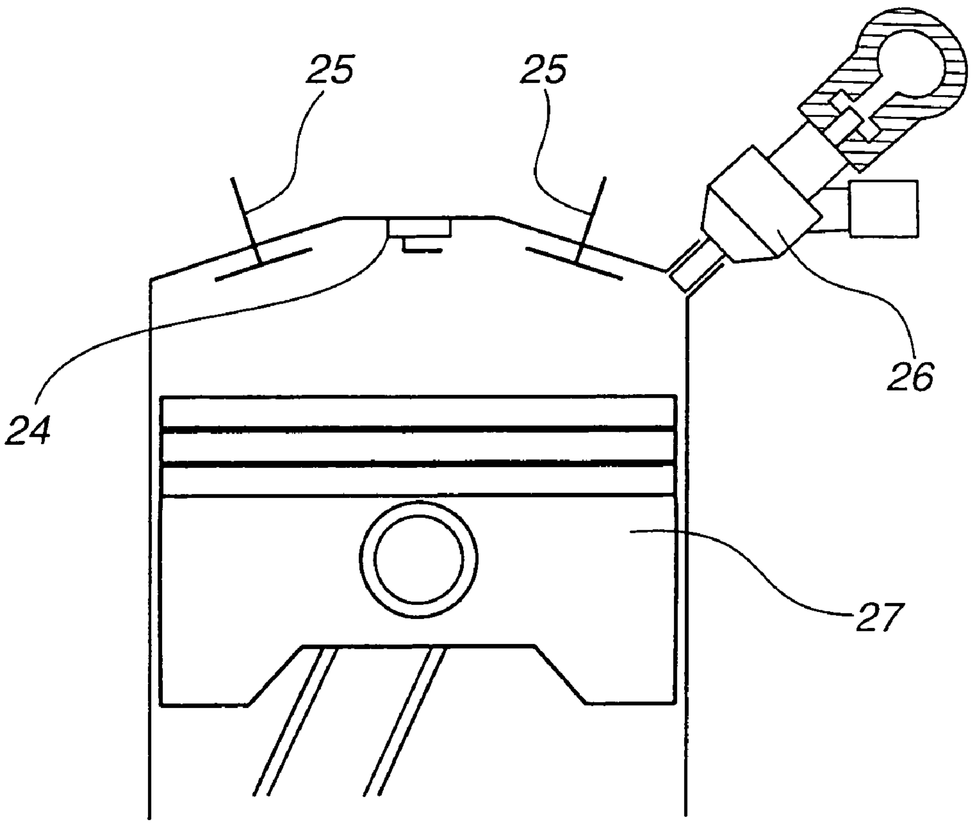
FIG. 4 is a schematic illustration of an example of a combustion chamber of an in-cylinder direct injection engine equipped with the fuel injection valve of FIG. 3.

Here, an embodiment of the fuel injection valve of the invention is shown in FIG. 3 and FIG. 4.

Such a fuel injection valve 26, which is used for an in-cylinder injection gasoline engine or a diesel engine, has a fuel injection valve body having a spray hole 21, a valve seat 22 to which a needle valve 23 is contactable, and is mounted in the combustion chamber as shown in FIG. 4. In fuel injection valve 26, the carbon-based coating film is preferably applied on regions such as the periphery of an outlet of spray hole 21, the inside of spray hole 21 (specifically, an inner surface defining the spray hole), and a tip end portion of needle valve 23. Since dimensional accuracy is required to the regions, thickness is preferably 10 μm or less, and more preferably 0.05 to 5 μm. On the other hand, the carbon-based coating film is preferably not applied to valve seat 22 in order to prevent insufficient airtight. Reference numerals 24, 25 and 27 indicate a spark plug, a valve, and a piston, respectively.

Next, a manufacturing or production method of the member for internal combustion engine of the invention will be described in detail.

In the production method of the invention, the carbon-based coating film is coated on the substrate by a vapor phase deposition to obtain the member for internal combustion engine. This enables formation of a uniform and thin coating film, and does not provide concern of corrosion of the orifice or a sealing surface unlike plating. Furthermore, in the case of the component having the orifice such as the fuel injection valve, penetration into the injection hole is shallow compared with the liquid phase deposition process, the need for masking required in the liquid phase deposition process is obviated.

Moreover, before coating the carbon-based coating film, it is preferable that the surface of the substrate is exposed to gas plasma of fluorine gas, hydrogen gas, oxygen gas or rare gases, and any combination thereof. In this case, since a surface to be deposited is cleaned by the gas in a plasma state, adhesion with the basic material tends to be improved.

Furthermore, it is preferable that stainless steel is used for the substrate, and rare gases are used for the gas. In this case, the stainless steel is exposed to plasma of the rare gases, thereby a passive-state layer on a surface of the steel can be effectively removed, and therefore adhesion with the coating film can be further ensured.

Use of plasma CVD is preferable for the vapor phase deposition process. In this case, many fluorine atoms can be taken in the carbon film. In addition, the film can be deposited at a lower temperature condition.

Hydrocarbon gas and fluorine-based gas are preferably used when the plasma CVD is used. When the middle layer is installed between the substrate and the carbon-based coating film, hydrocarbon gas, the silicon-based gas, or a mixture gas of the hydrocarbon bas and silicon-based gas is used. With this, the middle layer and the carbon-based coating film are successively deposited under control of the gas and the control condition. In this case, since the gas is made into a plasma state, thickness control for the coating film tends to be easily carried out. Moreover, deposition is comparatively easily performed even if an area to be coated with the coating film is large.

Examples of the hydrocarbon gas are methane ($CH_4$), ethane ($C_2H_6$), propane ($C_3H_8$), buthane ($C_4H_{10}$), acetylene ($C_2H_2$), benzene ($C_6H_6$), cyclohexane ($C_6H_{12}$), etc. Examples of the fluorine-based gas are fluorine ($F_2$), nitrogen trifluoride ($NF_3$), sulfur hexafluoride ($SF_6$), carbon tetrafluoride ($CF_4$), hexafluoroethane ($C_2F_6$), octafluorobutene ($C_4F_8$), silicon tetrafluoride ($SiF_4$), hexafluorodisilane ($Si_2F_6$), chlorine trifluoride ($ClF_3$), hydrogen fluoride (HF), etc. Examples of the silicon-based gas are monosilane ($SiH_4$), disilane ($Si_2H_6$), methylsilane ($CH_3SiH_3$), trimethylsilane ($CH_3)_3SiH$), tetramethylsilane ($(CH_3)_4Si$), etc.

Moreover, it is preferable to carry out the heat treatment at the condition of 80 to 270° C. after the deposition of the carbon-based coating film. In this case, the adhesion of the coating film is improved remarkably. If the temperature of the heat treatment is lower than 80° C., the heat treatment is not effective. If the temperature is higher than 270° C., the carbon-based coating film has the possibility of causing a heat deterioration. More preferably, the temperature is 120 to 220° C. and selected depending on a thermal resistive property of the substrate. The treatment time of the heat treatment can be selected suitably, and is preferably 1 to 24 hours in case of a mass production.

EXAMPLE

Hereinafter, the invention will be described further in detail according to examples and comparative examples, however, the invention is not intended to be limited to the examples.

Figure 5:
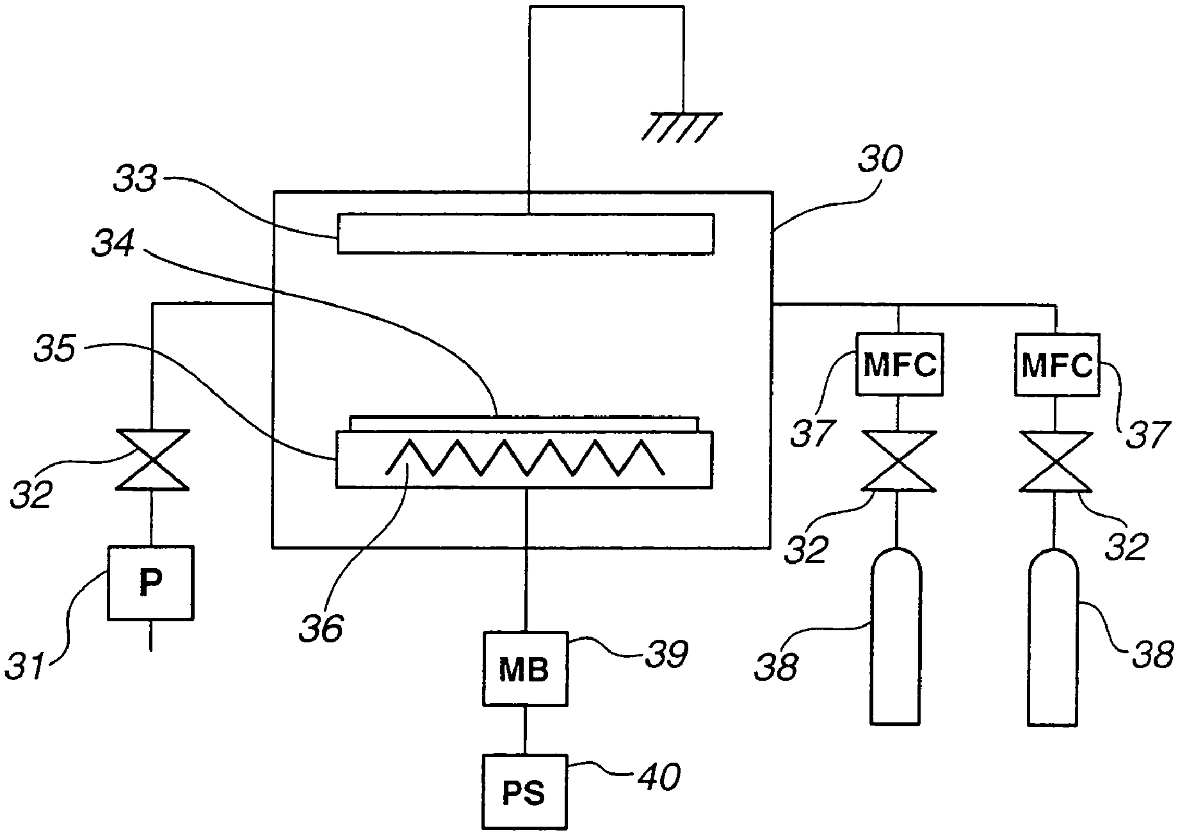
FIG. 5 is a schematic view of an example of an apparatus for depositing a carbon-based coating film.

A plasma CVD apparatus used in the invention is shown in FIG. 5.

A vacuum evacuation chamber 30 is connected with an evacuation pump 31 for vacuum evacuation and a bomb 38 for supplying gas. A pressure regulator 32 is arranged between evacuation pump 31 and vacuum evacuation chamber 30, so that the inside of vacuum evacuation chamber 30 can be regulated to a certain pressure. A MFC (mass flow controller) 37 is arranged between bomb 38 and vacuum evacuation chamber 30 in order to control a gas flow rate to a certain level.

An earth electrode 33 and a high frequency electrode 35 are arranged within vacuum evacuation chamber 30, and a substrate 34 is placed on the high frequency electrode 35. The reference numeral 36 denotes a heater. High frequency power is supplied from a high frequency power source 40 to a high frequency electrode 35 via a matching box 39.

Plasma is thus generated between earth electrode 33 and high frequency electrode 35. High frequency electrode 35 is desirably water-cooled to restrict temperature rise in substrate 34.

Example 1

Aluminum alloy AC2A was used for a base material of a piston, a surface of the alloy was mirror-finished, and then a coating film was deposited at the following conditions.

Pretreatment Condition

Pretreatment gas: Ar gas at 100 sccm (sccm=cm$^3$/min, at 25° C. and 1.0×10$^5$ Pa)

High frequency power: 300 W at a frequency of 13.56 MHz

Vacuum rate: 0.1 Torr

Processing time: 5 min

Deposition Condition

Deposition source gas: methane ($CH_4$) gas at 25 sccm, carbon fluoride ($C_2F_6$) gas at 25 sccm, High frequency power: 300 W at a frequency of 13.56 MHz Vacuum rate: 0.1 Torr Deposition rate: 300 A/min Deposition time: 17 min Thickness of the coating film was 0.5 μm, which was obtained from an electron-microscopic observation image; and an atomic number ratio of F content to C content in the region of from a surface to a depth of 4 nm, F/C, was 0.4, which was obtained from a X-ray photoelectron spectrometer (hereinafter, referred to as XPS) analysis. In addition, the coating film was subjected to Ar etching from the surface to a depth of 250 nm, and then an atomic number ratio of F content to C content at the depth was analyzed by XPS, as a result F/C of 0.15 was obtained.

The XPS analysis and the Ar etching were repeatedly performed for each of deposition conditions of examples 1 to 8, and consequently it was able to be found that the atomic number ratio of F content to C content was largest at an uppermost surface area, which was from the surface of the carbon-based coating film to the depth of 4 nm, and decreased with approach to the substrate. Thus, in the examples 1, 3, 6 and 7, the atomic number ratio of F content to C content at a depth of half the coating film thickness was measured, which was regarded as an average atomic number ratio of the content in the coating film as a whole.

Example 2

SUS420J was used for base materials of a valve and a fuel injection valve, and then surfaces of them were mirror-finished, and then a coating film was deposited at the following conditions.

Pretreatment Condition

Pretreatment gas: Ar gas at 100 sccm (sccm=cm$^3$/min, at 25° C. and 1.0×10$^5$ Pa)

High frequency power: 300 W at a frequency of 13.56 MHz

Vacuum rate: 0.1 Torr

Processing time: 5 min

Deposition Condition

Deposition source gas: methane ($CH_4$) gas at 50 sccm, carbon fluoride ($C_2F_6$) gas at 25 sccm High frequency power: 300 W at a frequency of 13.56 MHz Vacuum rate: 0.1 Torr Deposition rate: 250 A/min Deposition time: 20 min Thickness of the coating film was 0.5 μm, which was obtained from the electron-microscopic observation image; and the atomic number ratio of F content to C content from a surface to a depth of 4 nm, F/C, was 0.25, which was obtained from the XPS analysis.

Example 3

SUS420J was used for the base materials of the valve and the fuel injection valve, and then surfaces of them were mirror-finished, and then a coating film was deposited at the following conditions.

Pretreatment Condition

Pretreatment gas: Ar gas at 100 sccm (sccm=cm$^3$/min, at 25° C. and 10×10$^5$ Pa)

High frequency power: 300 W at a frequency of 13.56 MHz

Vacuum rate: 0.1 Torr

Processing time: 5 min

Deposition Condition

Deposition source gas: methane ($CH_4$) gas at 25 sccm, carbon fluoride ($C_2F_6$) gas at 25 sccm High frequency power: 300 W at a frequency of 13.56 MHz Vacuum rate: 0.1 Torr Deposition rate: 300 A/min Deposition time: 17 min Thickness of the coating film was 0.5 μm, which was obtained from the electron-microscopic observation image; and the atomic number ratio of F content to C content from a surface to a depth of 4 nm, F/C, was 0.4, which was obtained from the XPS analysis. In addition, the coating was subjected to Ar etching from the surface to a depth of 250 nm, and then the atomic number ratio of F content to C content at the depth was analyzed by XPS, as a result F/C of 0.15 was obtained.

Example 4

SUS420J was used for the base materials of the valve and the fuel injection valve, and then surfaces of them were mirror-finished, and then a coating film was deposited at the following conditions.

Pretreatment Condition

Pretreatment gas: Ar gas at 100 sccm (sccm=cm$^3$/min, at 25° C. and 1.10×10$^5$ Pa)

High frequency power: 300 W at a frequency of 13.56 MHz

Vacuum rate: 0.1 Torr

Processing time: 5 min

Deposition Condition

Deposition source gas: methane ($CH_4$) gas at 15 sccm, carbon fluoride ($C_2F_6$) gas at 25 sccm High frequency power: 300 W at a frequency of 13.56 MHz Vacuum rate: 0.1 Torr Deposition rate: 300 A/min Deposition time: 17 min Thickness of the coating film was 0.5 μm, which was obtained from the electron-microscopic observation image; and the atomic number ratio of F content to C content from a surface to a depth of 4 nm, F/C, was 0.65, which was obtained from the XPS analysis.

Example 5

SUS420J was used for the base materials of the valve and the fuel injection valve, and then surfaces of them were mirror-finished, and then a coating film was deposited at the following conditions.

Pretreatment Condition

Pretreatment gas: Ar gas at 100 sccm (sccm=$cm^3$/min, at 25° C. and $1.0\times10^5$ Pa)

High frequency power: 300 W at a frequency of 13.56 MHz

Vacuum rate: 0.1 Torr

Processing time: 5 min

Deposition Condition

Deposition source gas: methane ($CH_4$) gas at 10 sccm, carbon fluoride ($C_2F_6$) gas at 25 sccm High frequency power: 300 W at a frequency of 13.56 MHz Vacuum rate: 0.1 Torr Deposition rate: 200 A/min Deposition time: 25 min Thickness of the coating film was 0.5 μm, which was obtained from the electron-microscopic observation image; and the atomic number ratio of F content to C content from a surface to a depth of 4 nm, F/C, was 1.0, which was obtained from the XPS analysis.

Example 6

SUS420J was used for the base materials of the valve and the fuel injection valve, and then surfaces of them were mirror-finished, and then a coating film was deposited at the following conditions.

Pretreatment Condition

Pretreatment gas: Ar gas at 100 sccm (sccm=$cm^3$/min, at 25° C. and $1.0\times10^5$ Pa)

High frequency power: 300 W at a frequency of 13.56 MHz

Vacuum rate: 0.1 Torr

Processing time: 5 min

Deposition Condition

Deposition source gas: methane ($CH_4$) gas at 5 sccm, carbon fluoride ($C_2F_6$) gas at 25 sccm High frequency power: 300 W at a frequency of 13.56 MHz Vacuum rate: 0.1 Torr Deposition rate: 150 A/min Deposition time: 33 min Thickness of the coating film was 0.5 μm, which was obtained from the electron-microscopic observation image; and the atomic number ratio of F content to C content from a surface to a depth of 4 nm, F/C, was 1.3, which was obtained from the XPS analysis. In addition, the coating was subjected to Ar etching from the surface to a depth of 250 nm, and then the atomic number ratio of F content to C content at the depth was analyzed by XPS, as a result F/C of 0.42 was obtained.

Example 7

SUS420J was used for the base materials of the valve and the fuel injection valve, and then surfaces of them were mirror-finished, and then a coating film was deposited at the following conditions.

Pretreatment Condition

Pretreatment gas: Ar gas at 100 sccm (sccm=$cm^3$/min, at 25° C. and $1.0\times10^5$ Pa)

High frequency power: 300 W at a frequency of 13.56 MHz

Vacuum rate: 0.1 Torr

Processing time: 5 min

Deposition Condition

Deposition source gas: methane ($CH_4$) gas at 5 sccm, carbon fluoride ($C_2F_6$) gas at 25 sccm High frequency power: 300 W at a frequency of 13.56 MHz Vacuum rate: 0.1 Torr Deposition rate: 150 A/min Deposition time: 33 min Post-Treatment Condition Post-treatment gas: carbon fluoride ($C_2F_6$) gas at 100 sccm High frequency power: 500 W at a frequency of 13.56 MHz Vacuum rate: 0.1 Torr Processing time: 2 min Thickness of the coating film was 0.5 μm, which was obtained from the electron-microscopic observation image; and the atomic number ratio of F content to C content from a surface to a depth of 4 nm, F/C, was 1.35, which was obtained from the XPS analysis. In addition, the coating was subjected to Ar etching from the surface to a depth of 250 nm, and then the atomic number ratio of F content to C content at the depth was analyzed by XPS, as a result F/C of 0.42 was obtained.

Example 8

A coating film was deposited at the same conditions as in example 7 on a nozzle (SUS420J) of a fuel injection valve for a QR20DD engine manufactured by Nissan Motor Co., Ltd. Adhesion of the coating film was excellent, and change in spraying performance was not found before and after the deposition. Then, the nozzle was equipped in the QR20DD engine and subjected to a combustion test for 24 hr at an ambient temperature of 23° C. After that, adhesion of deposit was not found on the nozzle.

Example 9

A coating film was deposited at the same conditions as in example 7 on a crown surface (aluminum alloy AC2A) of a piston for the QR20DD engine manufactured by Nissan Motor Co., Ltd. Adhesion of the coating film was excellent, and change in sliding performance was not found before and after the deposition. Then, the crown surface was equipped in the QR20DD engine and subjected to a combustion test for 24 hr at an ambient temperature of 23° C. After that, adhesion of deposit was not found on the crown surface.

Example 10

A coating film was deposited at the same conditions as in example 7 on a valve stem (SUS420J) of a valve for the QR20DD engine manufactured by Nissan Motor Co., Ltd. Adhesion of the coating film was excellent, and change in valve performance was not found before and after the deposition. Then, the valve stem was equipped in the QR20DD engine and subjected to a combustion test for 24 hr at an ambient temperature of 23° C. After that, adhesion of deposit was not found on the shaft.

Example 11

SUS420J was used for the base material of the valve and the fuel injection valve, and then the surface roughness (Ra)

of them was set at 0.2 μm by a milling machine. A coating film was deposited at the same conditions as in example 7.

Example 12

SUS420J was used for the base material of the valve and the fuel injection valve, and then the surface roughness (Ra) of them was set at 0.2 μm by a milling machine. A coating film was deposited as a middle layer at the following conditions. Subsequently, a coating film was deposited at the same conditions as in example 7. The thickness of the middle layer (film) was 0.05 μm, which was obtained from the electron-microscopic observation image.

Pretreatment Condition

Pretreatment gas: Ar gas at 100 sccm (sccm=$cm^3$/min, at 25° C. and $1\times10^5$ Pa)

High frequency power: 300 W at a frequency of 13.56 MHz

Vacuum rate: 0.1 Torr

Processing time: 5 min

Deposition Condition

Deposition source gas: methane ($CH_4$) gas at 100 sccm

High frequency power: 300 W at a frequency of 13.56 MHz

Vacuum rate: 0.1 Torr

Deposition rate: 200 A/min

Deposition time: 2 min

Example 13

SUS420J was used for the base material of the valve and the fuel injection valve, and then the surface roughness (Ra) of them was set at 0.2 μm by a milling machine. A coating film was deposited as a middle layer at the following conditions. Subsequently, a coating film was deposited at the same conditions as in example 7. The thickness of the middle layer (film) was 0.05 μm, which was obtained from the electron-microscopic observation image.

Pretreatment Condition

Pretreatment gas: Ar gas at 100 sccm (sccm=$cm^3$/min, at 25° C. and $1.0\times10^5$ Pa)

High frequency power: 300 W at a frequency of 13.56 MHz

Vacuum rate: 0.1 Torr

Processing time: 5 min

Deposition Condition

Deposition source gas: trimethylsilane ($(CH_3)_3SiH$) gas at 60 sccm

High frequency power: 100 W at a frequency of 13.56 MHz

Vacuum rate: 0.1 Torr

Deposition rate: 100 A/min

Deposition time: 5 min

Example 14

The test piece obtained in example 11 was heated in a thermostatic chamber at 80° C. for 24 hours.

Example 15

The test piece obtained in example 11 was heated in a thermostatic chamber at 200° C. for 6 hours.

Comparative Example 1

A surface of aluminum alloy AC2A as a base material of a piston was mirror-finished to form a specimen.

Comparative Example 2

A surface of SUS420J as base materials of a valve and a fuel injection valve was mirror-finished to form specimens.

Comparative Example 3

SUS420J was used for the base materials of the valve and the fuel injection valve, and then surfaces of them were mirror-finished, and then a coating film was deposited at the following conditions.

Pretreatment Condition

Pretreatment gas: Ar gas at 100 sccm (sccm=$cm^3$/min, at 25° C. and $1.0\times10^5$ Pa)

High frequency power: 300 W at a frequency of 13.56 MHz

Vacuum rate: 0.1 Torr

Processing time: 5 min

Deposition Condition

Deposition source gas: methane ($CH_4$) gas at 100 sccm

High frequency power: 300 W at a frequency of 13.56 MHz

Vacuum rate: 0.1 Torr

Deposition rate: 100 A/min

Deposition time: 50 min

Thickness of the coating film was 0.5 μm, which was obtained from the electron-microscopic observation image; and the atomic number ratio of F content to C content from a surface to a depth of 4 nm was 0, which was obtained from the XPS analysis.

Comparative Example 4

SUS420J was used for the base materials of the valve and the fuel injection valve, and then surfaces of them were mirror-finished, and then PTFE (polytetrafluoroethylene) coating was performed by dipping. Thickness of the coating film was 20 μm, which was obtained from the electron-microscopic observation image.

Comparative Example 5

The fuel injection valve for the QR20DD engine manufactured by Nissan Motor Co., Ltd was equipped in the engine, and then subjected to the combustion test for 24 hr at an ambient temperature of 23° C. After that, adhesion of deposit was found near the nozzle spray hole.

EVALUATION TEST

For each of specimens or test pieces, a water contact angle, a deposit adhesion height, and a deposit peeling state were measured as discussed below. The results are shown in Table 1. Additionally, a boiling water immersion test and a fuel immersion test were conducted. The result of the tests are shown in Table 2.

TABLE 1

| | Substrate | F/C | Surface condition of substrate | Post-treatment with $C_2F_6$ | Coating thickness (μm) | Water contact angle (°) | Deposit adhesion height (mm) | Deposit peeling state | Remarks |
|---|---|---|---|---|---|---|---|---|---|
| Example 1 | AC2A | 0.4 | Mirror surface | Not made | 0.5 | 98 | 1.3 | Interfacial peeling | |
| Example 2 | SUS420J | 0.25 | Mirror surface | Not made | 0.5 | | 1 | Cohesive failure | |
| Example 3 | SUS420J | 0.4 | Mirror surface | Not made | 0.5 | 98 | 1.3 | Interfacial peeling | |
| Example 4 | SUS420J | 0.65 | Mirror surface | Not made | 0.5 | | 1.4 | Interfacial peeling | |
| Example 5 | SUS420J | 1 | Mirror surface | Not made | 0.5 | | 1.5 | Interfacial peeling | |
| Example 6 | SUS420J | 1.3 | Mirror surface | Not made | 0.5 | 115 | 1.6 | Interfacial peeling | |
| Example 7 | SUS420J | 1.35 | Mirror surface | Made | 0.5 | 113 | 1.8 | Interfacial peeling | |
| Example 8 | Fuel injection valve | 1.35 | — | Made | 0.5 | — | — | | No adhesion of deposit |
| Example 9 | Crown surface of piston (AC2A) | 1.35 | — | Made | 0.5 | — | — | | No adhesion of deposit |
| Example 10 | Valve shaft (SUS420J) | 1.35 | — | Made | 0.5 | — | — | | No adhesion of deposit |
| Comparative example 1 | AC2A | — | Mirror surface | — | — | 70 | 0.8 | Cohesive failure | |
| Comparative example 2 | SUS420J | — | Mirror surface | — | — | 99 | 1.4 | Cohesive failure | |
| Comparative example 3 | SUS420J | 0 | Mirror surface | Not made | 0.5 | | 0.8 | Cohesive failure | |
| Comparative example 4 | SUS420J | — | Mirror surface | — | 20 | 112 | 1.5 | Interfacial peeling | PTFE coating |
| Comparative example 5 | Fuel injection valve | | — | — | 0.5 | — | — | — | Adhesion of deposit |

TABLE 2

| | Substrate | F/C | Surface roughness (Ra) | Post-treatment with $C_2F_6$ | Middle layer | Thermal Aging | Condition after boiling water immersion | Condition after fuel immersion |
|---|---|---|---|---|---|---|---|---|
| Example 7 | SUS420J | 1.35 | Mirror surface | Made | None | None | D | D |
| Example 11 | SUS420J | 1.35 | 0.2 | Made | None | None | C | C |
| Example 12 | SUS420J | 1.35 | 0.2 | Made | DLC | None | C | B |
| Example 13 | SUS420J | 1.35 | 0.2 | Made | SiC | None | C-B | B |
| Example 14 | SUS420J | 1.35 | 0.2 | Made | None | 80° C., 4 h | B | B |
| Example 15 | SUS420J | 1.35 | 0.2 | Made | None | 200° C., 6 h | A | A |

1. Water Contact Angle

A contact angle was measured at the room temperature using distilled water.

Here, the water contact angle indicates that as the angle is larger, water repellency increases and a polar liquid such as water is thus easy to be repelled, and therefore concentrated, deteriorated gasoline that is origin of the deposit is hard to be adhered.

2. Deposit Adhesion Height

Gasoline was oxidized to be deteriorated, and resultant gum contents were extracted, by which solid test deposit was prepared.

The test deposit of 20 mg was exactly measured, and placed on test piece and melted by heating to 150° C., and then cooled to the room temperature. After that, height of the deposit adhered on the test piece was measured.

3. Deposit Peeling State

The adhered deposit was peeled from the test piece used in the measurement of deposit adhesion using SAICAS manufactured by DAIPLA WINTES CO., LTD, and peeling configurations at that time were observed. A Borazon cutter 4 mm in thickness was used for a cutter for the test, clearance to the test piece was set to 2 μm, and moving speed was determined to be 2 μm/sec.

From Table 1, it was known that repellency to deposit was improved as the content of fluorine element in the carbon-based coating film was increased, and further excellent repellency was able to be obtained by fluorine-gas plasma treatment to the surface.

4. Boiling Water Immersion Test

The test piece obtained in examples was immersed in boiling distilled water under reflux for 24 hours, and cooled down to room temperature. Thereafter, the adhesion of the coating film was checked under a visual observation using a loupe of 10 magnifications. The (adhesion) condition of the coating film after boiling water immersion is shown in Table 2 in which A indicates the condition of "not peeled"; B indicates the condition of "not peeled at all"; C indicates the condition of "peeled a little"; and D indicates the condition of "peeled".

5. Fuel Immersion Test

The test piece obtained in examples was immersed in a test fuel at 60° C. for 1000 hours, and cooled down to room temperature. Thereafter, the adhesion of the coating film was checked under a visual observation using a loupe of 10 magnifications. The (adhesion) condition of the coating film after fuel immersion is shown in Table 2 in which A indicates the condition of "not peeled"; B indicates the condition of "not peeled at all"; C indicates the condition of "peeled a little"; and D indicates the condition of "peeled".

From Table 2, it was known that the an adhesion durability of the coating film was improved by optimization of the roughness of the substrate, installing the middle layer and carrying out the heat treatment after the deposition of the coating film.

Hereinbefore, the invention has been described in detail according to the preferred examples, however, the invention is not limited to them, and various modifications can be made within a scope of the gist of the invention.

For example, the member for internal combustion engine of the invention can be used for, not limited to the piston, the valve and the fuel injection valve, other components (a spark plug, a cylinder head, and a piston ring) in connection with the combustion chamber while reducing the adhesion of deposit on the components in connection with the combustion chamber without deteriorating performance of the components.

As appreciated from the above, according to the invention, since a carbon-based thin-film that contains fluorine and has a thickness of 10 μm or less is coated on a fuel contacting region, adhesion and deposition of the deposit are prevented and therefore efficient combustion operation is carried out.

The entire contents of Japanese Patent Application Nos. 2004-266612, filed Sep. 14, 2004, and 2005-257422, filed Sep. 6, 2005 are incorporated herein by reference.

Although the invention has been described above by reference to certain embodiments and examples of the invention, the invention is not limited to the embodiments and examples described above. Modifications and variations of the embodiments and examples described above will occur to those skilled in the art, in light of the above teachings. The scope of the invention is defined with reference to the following claims.

What is claimed is:

1. A member for an internal combustion engine, comprising:

a substrate; and a carbon-based coating film formed on the substrate to cover at least a part of a region of the substrate to which region fuel for the internal combustion engine is contactable, the carbon-based coating film containing fluorine and having a thickness of 10 μm or less, wherein the carbon-based coating film has a fluorine and carbon content of (fluorine/carbon) ≧0.25 in atomic number ratio.

2. The member for an internal combustion engine, as claimed in claim 1, wherein the carbon-based coating film has a thickness within a range of from 0.05 to 5 μm.

3. The member for an internal combustion engine as claimed in claim 1, wherein the fluorine and carbon content in a region of from an uppermost surface to a depth of 4 nm in the carbon-based coating film is (fluorine/carbon) ≧0.4 in atomic number ratio.

4. The member for an internal combustion engine, as claimed in claim 1, wherein the fluorine and carbon content in a region of from an uppermost surface to a depth of 4 nm in the carbon-based coating film is (fluorine/carbon) ≧1 in atomic number ratio.

5. The member for an internal combustion engine as claimed in claim 1, wherein a fluorine content in the carbon-based coating film is largest at an uppermost surface portion of the carbon-based coating film and decreases with approach to the substrate.

6. The member for an internal combustion engine as claimed in claim 1, further comprising a middle layer film containing at least one of carbon and silicon, wherein the middle layer film is located between an uppermost film and the substrate.

7. The member for an internal combustion engine as claimed in claim 1, wherein the substrate has a surface roughness (Ra) ranging from 0.1 to 3 μm.

8. The member for an internal combustion engine as claimed in claim 1, wherein the member is subjected to a heat treatment at a temperature ranging from 80 to 270° C. after formation of the carbon-based coating film.

9. A piston for an internal combustion engine, comprising:

a substrate, wherein the substrate is a piston body; and a carbon-based coating film formed on the piston body to cover at least a part of a region of the piston body to which region fuel for the internal combustion engine is contactable, the carbon-based coating film containing fluorine and having a thickness of 10 μm or less, wherein the carbon-based coating film has a fluorine and carbon content of (fluorine/carbon) ≧0.25 in atomic number ratio, wherein at least a crown surface of the piston body is coated with the carbon-based coating film.

10. A valve for an internal combustion engine, comprising:

a substrate, wherein the substrate is a valve body; and a carbon-based coating film formed on the valve body to cover at least a part of a region of the valve body to which region fuel for the internal combustion engine is contactable, the carbon-based coating film containing fluorine and having a thickness of 10 μm or less, wherein the carbon-based coating film has a fluorine and carbon content of (fluorine/carbon) ≧0.25 in atomic number ratio, wherein at least a part selected from the group consisting of a valve stem, a valve head and a surface portion at a side of a combustion chamber is coated with the carbon-based coating film.

11. A fuel injection valve for an internal combustion engine, comprising:

a substrate, wherein the substrate is a fuel injection valve body; and a carbon-based coating film formed on the fuel injection valve body to cover at least a part of a region of the fuel injection valve body to which region fuel for the internal combustion engine is contactable, the carbon-based coating film containing fluorine and having a thickness of 10 μm or less, wherein the carbon-based coating film has a fluorine and carbon content of (fluorine/carbon) ≧0.25 in atomic number ratio, wherein at least an inner surface of the injection valve body, defining an injection hole, is coated with the carbon-based coating film.

12. A method of producing a member for an internal combustion engine, the member including a substrate; and a carbon-based coating film formed on the substrate to cover at least a part of a region of the substrate to which region fuel for the internal combustion engine is contactable, the carbon-based coating film containing fluorine and having a thickness of 10 μm or less, the method comprising:

forming the carbon-based coating film on the substrate by a vapor phase deposition process, wherein the carbon-based coating film has a fluorine and carbon content of (fluorine/carbon) ≧0.25 in atomic number ratio.

13. The method of producing a member for an internal combustion engine as claimed in claim 12, further comprising exposing a surface of the substrate to plasma of at least one gas selected from the group consisting of fluorine gas, hydrogen gas, oxygen gas and rare gas, before forming the carbon-based coating film.

14. The method of producing a member for an internal combustion engine as claimed in claim 13, wherein the substrate is formed of stainless steel, and the at least one gas is rare gas.

15. The method of producing a member for an internal combustion engine as claimed in claim 12, wherein the vapor phase deposition process is plasma CVD.

16. The method of producing a member for an internal combustion engine as claimed in claim 15, wherein hydrocarbon gas and fluorine-based gas in the plasma CVD are used as source gas for deposition.

17. The method of producing a member for an internal combustion engine as claimed in claim 12, further comprising carrying out a heat treatment at a temperature ranging from 80 to 270° C. on the member after the formation of the carbon-based coating film.

* * * * *